(12) United States Patent
Zurowski et al.

(10) Patent No.: US 8,837,140 B2
(45) Date of Patent: Sep. 16, 2014

(54) CLOSED AND INTERNAL COOLING SYSTEM FOR CAR RADIO

(75) Inventors: Miroslaw J. Zurowski, Krakow (PL); Jacek Andrzejewski, Skawina (PL); Michal Kamon, Zielonki (PL)

(73) Assignee: Delphi Technologies, Inc., Troy, MI (US)

( * ) Notice: Subject to any disclaimer, the term of this patent is extended or adjusted under 35 U.S.C. 154(b) by 208 days.

(21) Appl. No.: 13/393,865

(22) PCT Filed: Aug. 12, 2010

(86) PCT No.: PCT/EP2010/061781
§ 371 (c)(1),
(2), (4) Date: Mar. 2, 2012

(87) PCT Pub. No.: WO2011/026722
PCT Pub. Date: Mar. 10, 2011

(65) Prior Publication Data
US 2012/0181003 A1  Jul. 19, 2012

(51) Int. Cl.
*H05K 7/20* (2006.01)

(52) U.S. Cl.
CPC .................................. *H05K 7/20154* (2013.01)
USPC ................. 361/679.49; 361/679.54; 361/691; 361/695; 361/697

(58) Field of Classification Search
USPC ........................ 361/676–678, 679.46–679.54, 361/688–722, 752, 760, 831
See application file for complete search history.

(56) References Cited

U.S. PATENT DOCUMENTS

| | | | |
|---|---|---|---|
| 5,339,362 A | 8/1994 | Harris | |
| 5,546,273 A | 8/1996 | Harris | |
| 6,084,774 A | 7/2000 | Talbot et al. | |
| 6,466,441 B1 * | 10/2002 | Suzuki | 361/695 |
| 6,735,081 B1 * | 5/2004 | Bishop et al. | 361/695 |
| 8,081,465 B2 * | 12/2011 | Nishiura | 361/703 |
| 8,462,495 B1 * | 6/2013 | Keefe et al. | 361/679.46 |
| 8,467,188 B2 * | 6/2013 | Hsieh et al. | 361/698 |
| 8,570,734 B2 * | 10/2013 | Yang | 361/679.5 |
| 2002/0122296 A1 * | 9/2002 | Stone et al. | 361/687 |
| 2006/0055833 A1 | 3/2006 | Lee et al. | |
| 2006/0292918 A1 * | 12/2006 | Behl | 439/374 |
| 2007/0041159 A1 * | 2/2007 | Bate | 361/697 |
| 2007/0068366 A1 | 3/2007 | Hamaoka et al. | |
| 2007/0083298 A1 | 4/2007 | Pierce et al. | |
| 2009/0139261 A1 | 6/2009 | Nakano et al. | |
| 2012/0210730 A1 * | 8/2012 | Pruett et al. | 62/3.2 |

FOREIGN PATENT DOCUMENTS

| | | |
|---|---|---|
| EP | 1769973 | 4/2007 |
| EP | 1901599 | 3/2008 |

OTHER PUBLICATIONS

International Search Report dated, Oct. 14, 2010.

* cited by examiner

*Primary Examiner* — Courtney Smith
(74) *Attorney, Agent, or Firm* — J. Gordon Lewis

(57) ABSTRACT

A vehicle audio apparatus such as a car radio includes a casing defined by external walls and electrical components mounted on a printed circuit board. The radio also includes a cooling system having a fan arranged in a first external wall of the casing, an opening arranged in a second opposite external wall, and a cooling plate which forms a heat sink and which is adjacent to at least one electrical component producing heat. The cooling plate and an associated internal cover plate have a combined shape optimized for guiding the air flow between the fan and the cooling opening.

8 Claims, 3 Drawing Sheets

CLOSED AND INTERNAL COOLING SYSTEM FOR CAR RADIO

TECHNICAL FIELD

The present invention relates generally to a vehicle audio apparatus and more particularly to a car radio.

BACKGROUND OF THE INVENTION

The present invention relates more particularly to a car radio comprising a parallelepiped casing, or radio chassis, defined by external walls and containing electrical components mounted on several printed circuit boards.

Some electrical components which are present on several PCBs inside the car radio emit a lot of heat and their cooling process has to be solved.

Generally, the PCBs are positioned near the side walls of the casing and the side walls comprise openings allowing the heat to be evacuated outside the casing by natural convection.

In some applications, particularly when the casing is very compact, it is not possible to position the PCBs in this manner.

An object of the present invention is to provide a solution for an effective cooling system in a compact size car radio chassis.

SUMMARY OF THE INVENTION

In order to solve the above mentioned problems, the present invention proposes a vehicle audio apparatus such as a car radio comprising a casing defined by external walls including substantially parallel lateral walls and substantially parallel transversal walls, and containing electrical components mounted on at least one printed circuit board extending substantially in parallel above a first of said transversal walls, at least one of said electrical components producing heat, and comprising cooling means which include:
- at least one fan which is arranged in a first lateral wall of said casing,
- a cooling opening arranged in a second lateral wall opposite to the first one,
- characterized in that it further comprises:
- an internal cooling plate which forms a heat sink and which is adjacent to said electrical component producing heat, said cooling plate extending substantially in parallel to said first transversal wall above said printed circuit board on which said electrical component producing heat is mounted, said cooling plate having a shape optimized for guiding the air flow between the fan and the cooling opening, and
- an internal cover plate which extends over the cooling plate, the air flowing between the cover plate and the cooling plate.

Thanks to the present invention, the air flow is guided inside a special tunnel and the cooling plate isolates the electrical components and the PCBs from the air flow to ensure:
- dust protection,
- good sealing preventing from any unwanted forced air movement (leak),
- hot air is directed in a specific way not to let overheat temperature in sensitive components.

Preferably the cooling plate is made from aluminum to absorb heat from hot components.

Shape of tunnel ensures easy air flow through the whole car radio.

According to other features of the invention:
- said cooling plate comprises longitudinal fins which extends along the air flow, said fins accumulating heat which is blown away by the air;
- the cooling plate face facing the printed circuit board comprises contact surfaces which are in contact with corresponding surfaces of the electrical components producing heat;
- the cooling plate and the cover plate are fixed to each other in order to form a closed air tunnel with only openings only towards the exterior of the casing;
- a disc driving unit is arranged in the casing between a second transversal wall and the cover plate;
- the fan is pulsing air into the casing towards the cooling opening;
- the casing is essentially parallelepiped and comprises a front panel substantially orthogonal to the lateral walls and to the transversal walls, said front panel including a user interface for controlling the vehicle audio apparatus;
- the front panel includes an access opening for the disc drive unit;
- the vehicle audio apparatus constitutes a car radio designed to be mounted in a complementary radio housing located in the dashboard of a vehicle passenger compartment.

BRIEF DESCRIPTION OF THE DRAWINGS

The present invention is now described by way of example with reference to the accompanying drawings in which.

DESCRIPTION OF THE PREFERRED EMBODIMENTS

In the following description, similar elements could be designated with the same reference numbers.

Figure 1:
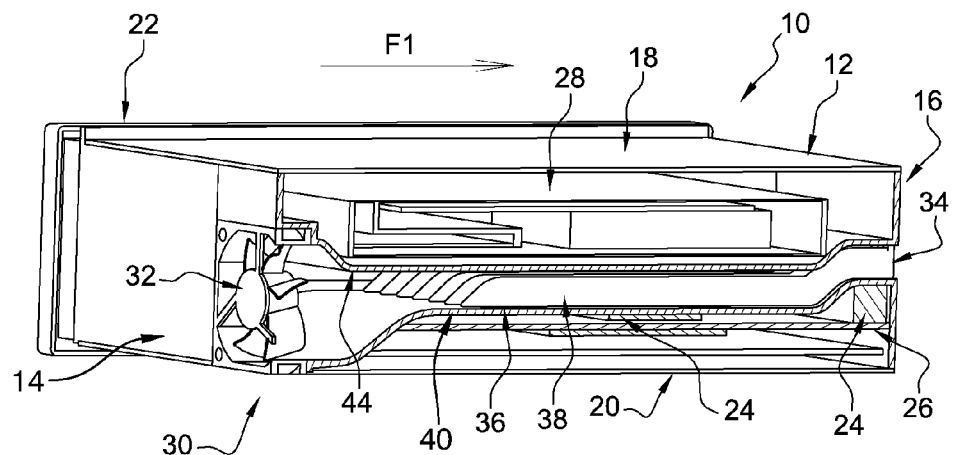
FIG. 1 a perspective view with cross section showing a car radio with cooling means according to the present invention.
Figure 2:
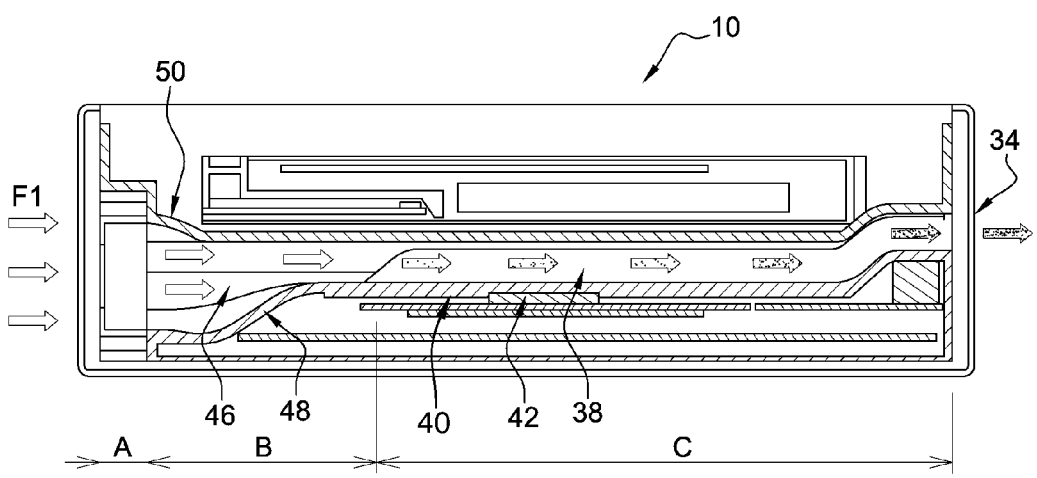
FIG. 2 is a cross section view showing the car radio of FIG. 1.
Figure 3:
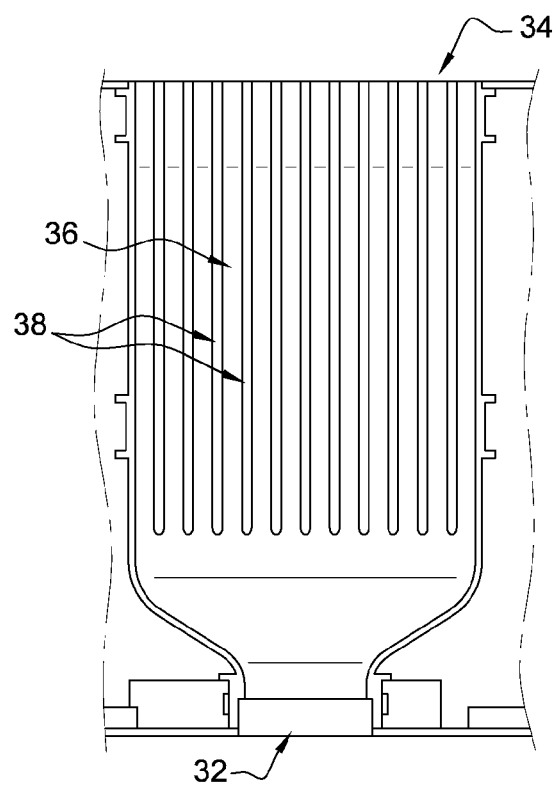
FIG. 3 is an upper view showing a cooling plate mounted in the car radio of FIG. 1.
Figure 4:
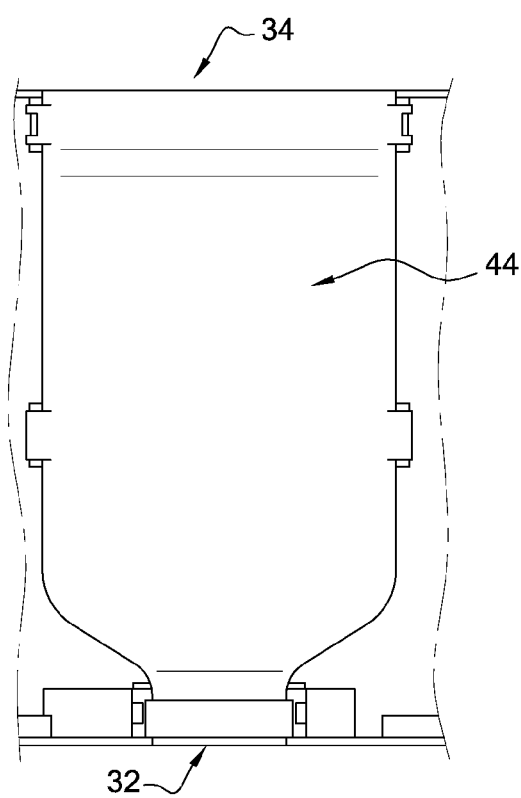
FIG. 4 is a lower view showing a cover plate mounted in the car radio of FIG. 1.
Figure 5:
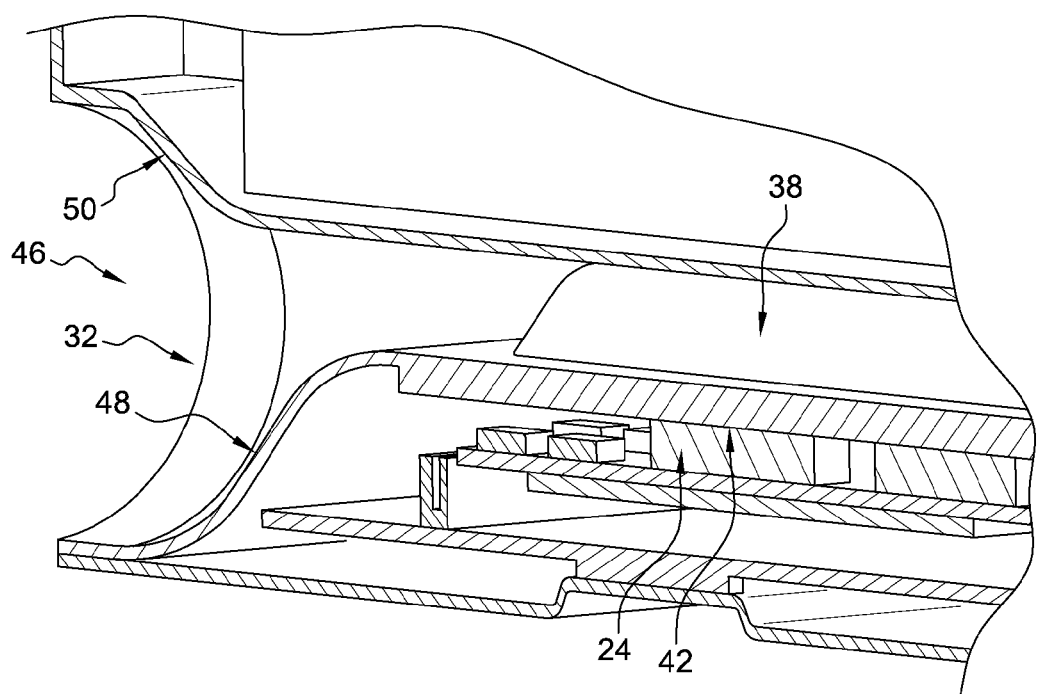
FIG. 5 is a detailed perspective view showing the cooling means of FIG. 1.

On FIGS. 1 and 2 is represented a car radio 10 according to a preferred embodiment of the present invention.

In a non limiting purpose, a vertical orientation will be used in connection with FIGS. 1 and 2.

The car radio 10 comprises a casing 12, or radio chassis, defined by a first and a second lateral external walls 14, 16, an upper 18 and a lower 20 transversal walls, a front panel 22 on which can be arranged the user interface (not shown), and a bottom wall which is not shown on the figures. The casing 12 is generally mounted in a complementary radio housing (not shown) located in the dashboard of a vehicle passenger compartment.

The casing 12 contains electrical components 24 mounted on several printed circuit boards 26, some of the electrical components produce a lot of heat when the car radio is functioning. According to the present embodiment, said printed circuit boards 26 are extending parallel to the inner face of the lower transversal wall 20, some of the electrical components 24 being arranged on the upper side of the PCB.

According to the embodiment shown, the car radio 10 comprises a disc drive unit 28 which is arranged parallel to the inner face of the upper transversal wall 18 of the casing 12, in the upper part of the casing 12. This disc drive unit 28 is for example able to read Compact-Disc and/or Digital Versatile Disc. Preferably it is a disc drive unit of the thin type wherein the optical unit comprising the lens is not sealed and could be exposed to dust. The thickness of such a drive unit is generally less than 20 millimeters, for example 14 millimeters, compared to standard drive units of 27 millimeters.

According to the present invention, the casing 12 includes cooling means 30 comprising:
- at least one fan 32 which is arranged in the first lateral wall 14,
- a cooling opening or outlet 34 which is arranged in the second lateral wall 16,
- a cooling plate 36 which forms a heat sink and which is adjacent to at least one electrical component 24 producing heat, said cooling plate 36 having a shape optimized for guiding the air flow from the fan 32 to the outlet opening 34.

Advantageously, said cooling plate 36 comprises longitudinal fins 38 which extend along the air flow, longitudinally from left to right with regards to FIGS. 1 and 2.

The cooling plate face 40 facing the printed circuit boards 26 comprises contact surfaces 42 which are in contact, through a heat transferring intermediate material such as a resin, with corresponding surfaces of the electrical components 24 producing heat.

The casing 12 further comprises a cover plate 44 which extends over the cooling plate 36, the air flowing in a longitudinal air duct 46, or air tunnel, defined between the cover plate and the cooling plate.

Advantageously, the cover plate 44 and the cooling plate 36 are fixed together to form an air tunnel which is isolated from the other components of the car radio 10. The air tunnel only openings are the fan inlet and the outlet 34.

The disc driving unit 28 is arranged in between the upper wall 18 and the cover plate 44.

The fan 32 is pulsing air into the casing 12 towards the cooling outlet 34.

Advantageously, the radial dimension of the fan 32 is superior to the vertical thickness of the air duct 46 between the cover plate and the cooling plate. Therefore, each plate comprises a flared end portion 48, 50 adjacent to the fan inlet so as to guide the air coming from the fan towards the fins and the outlet 34. It can be noticed that the cross section of the air duct 46 at the fan inlet is bigger than the cross section of the air duct 46 at the outlet 34 which contributes to air acceleration and optimal cooling.

Advantageously, the fins vertical dimension is approximately identical to the air duct 46 vertical dimension. Preferably, the fins 38 extend along the air duct 46 from just after the flared end portion 48, 50 until the outlet 34.

According to the embodiment shown, air is flowing through the casing 12, inside the air duct 46, along a longitudinal direction F1, from left towards right according to FIGS. 1 and 2. In a first longitudinal portion A of the air duct 46, corresponding to the fan inlet, air is accelerated. In a second longitudinal portion B of the air duct 46, corresponding to the flared end portion 48, 50, air is orientated. In a third longitudinal portion C of the air duct 46, corresponding to the fins 38, air gets heat from the electronic components 24.

The invention claimed is:

1. A vehicle audio apparatus comprising a casing defined by external walls including substantially parallel lateral walls and substantially parallel transversal walls, and containing at least one electrical component mounted on at least one printed circuit board extending substantially in parallel adjacent a first of said transversal walls, at least one of said electrical components producing heat, and comprising cooling means which include:
    at least one fan arranged in a first lateral wall of said casing,
    a cooling opening arranged in a second lateral wall opposite to the first lateral wall,
    an internal cooling plate forming a heat sink and which is adjacent to said electrical component producing heat, said cooling plate extending substantially in parallel to said first transversal wall above said printed circuit board on which said electrical component producing heat is mounted, said cooling plate having a shape optimized for guiding the air flow between the fan and the cooling opening, and
    an internal cover plate which extends over the cooling plate, the air flowing between the cover plate and the cooling plate,
    wherein said cooling plate comprises longitudinal fins which extend along the air flow, and
    wherein the cooling plate face facing the printed circuit board comprises contact surfaces which are in contact with corresponding surfaces of the electrical components producing heat.

2. The vehicle audio apparatus of claim 1, wherein the cooling plate and the cover plate are fixed to each other to form a substantially closed air tunnel with openings directed only towards the exterior of the casing.

3. The vehicle audio apparatus of claim 2, further comprising a disc drive unit arranged in the casing between a second transversal wall and the cover plate.

4. The vehicle audio apparatus of claim 1, wherein the fan is operative to direct air into the casing towards the cooling opening.

5. The vehicle audio apparatus of claim 1, wherein the casing is essentially a parallelepiped and comprises a front panel substantially orthogonal to the lateral walls and to the transversal walls, said front panel including a user interface for controlling the vehicle audio apparatus.

6. The vehicle audio apparatus of claim 5, wherein the front panel includes an access opening for the disc drive unit.

7. The vehicle audio apparatus of claim 1, wherein said apparatus comprises a car radio configured for mounting in a complementary radio housing located in the dashboard of a vehicle passenger compartment.

8. A vehicle audio apparatus comprising a casing defined by external walls, including substantially parallel opposed lateral walls and substantially parallel transversal walls, and containing at least one electrical component mounted on at least one printed circuit board extending substantially parallel adjacent a first of said transversal walls, at least one of said electrical components producing heat, and cooling means comprising:
    at least one fan arranged in a first lateral wall of said casing;
    a cooling opening arranged in a second lateral wall opposite to the first lateral wall;
    an internal cooling plate forming a heat sink disposed adjacent said electrical component producing heat, said cooling plate extending substantially in parallel to said first transversal wall above said printed circuit board on which said electrical component producing heat is mounted, said cooling plate forming a through-passage having a tapered shape and a plurality of substantially parallel spaced-apart longitudinal cooling fins operative to guide the air flow between the fan and the cooling opening; and
    an internal cover plate which extends over the cooling plate to form said substantially closed passage, the air flowing between the cover plate and the cooling plate, wherein said cooling plate comprises longitudinal fins which extend along the air flow, and wherein the cooling plate face facing the printed circuit board comprises contact surfaces which are in contact with corresponding surfaces of the electrical components producing heat.

\* \* \* \* \*